United States Patent [19]
Fierkens

[11] Patent Number: 5,622,731
[45] Date of Patent: Apr. 22, 1997

[54] AUTOMATIC POST MOLD CURING APPARATUS FOR USE IN PROVIDING ENCAPSULATED SEMICONDUCTOR CHIPS AND METHOD THEREFOR

[76] Inventor: Richard H. J. Fierkens, Kuerbeck 15, 6914 AE Herwen, Netherlands

[21] Appl. No.: 118,601

[22] Filed: Sep. 10, 1993

[51] Int. Cl.⁶ .............................. B29C 35/02; B29C 35/18
[52] U.S. Cl. .......................... 425/384; 264/236; 264/247; 264/272.17; 425/402; 425/403.1; 425/404; 425/445; 437/247; 437/248; 438/123; 438/124; 29/827; 29/740
[58] Field of Search .............................. 264/272.17, 347, 264/236, 237; 425/384, 403.1, 402, 404, 445; 437/248, 247

[56] References Cited

U.S. PATENT DOCUMENTS

| | | | |
|---|---|---|---|
| 4,383,964 | 5/1983 | Prus | 425/404 |
| 5,492,866 | 2/1996 | Nishikawa | 427/248 |

FOREIGN PATENT DOCUMENTS

| | | | |
|---|---|---|---|
| 63-316443 | 12/1988 | Japan | 437/248 |
| 2-196414 | 8/1990 | Japan | 437/248 |

*Primary Examiner*—Khanh P. Nguyen
*Attorney, Agent, or Firm*—Harry M. Weiss; Jeffrey D. Moy; Harry M. Weiss & Associates, P.C.

[57] ABSTRACT

A post mold curing apparatus for use in association with a molding line system for providing plastic encapsulated semiconductor chips mounted on leadframes is disclosed which includes a leadframe carrier having a rotary, substantially cylindrical shaped assembly for containing and moving a plurality of semiconductor chips and their associated leadframe strips into both an elevated temperature post mold curing region and into a lower temperature cool-down region. Each of the leadframe strips with their associated semiconductor chips are sequentially inserted into cavity regions located in the cylindrical assembly to assist in moving each of the plurality of leadframe strips through the elevated temperature post mold curing region, and subsequently, each of the leadframe strips with their associated semiconductor chips are removed from the cavity regions after passing through the lower temperature cool-down region.

8 Claims, 2 Drawing Sheets

AUTOMATIC POST MOLD CURING APPARATUS FOR USE IN PROVIDING ENCAPSULATED SEMICONDUCTOR CHIPS AND METHOD THEREFOR

FIELD OF THE INVENTION

This invention relates generally to molding line systems for producing encapsulated semiconductor chips and, more specifically, to an automatic post mold curing apparatus for use in this type of system and method therefor which provides a substantially cylindrical assembly which holds and rotates a plurality of encapsulated semiconductor chips and their associated leadframe strips through both an elevated temperature post mold curing region and a low temperature cool-down region.

DESCRIPTION OF THE PRIOR ART

After having been encapsulated, semiconductor chips need to be cured at an heightened temperature for a substantial period of time. In the past, this part of the production of encapsulated semiconductor chips has been accomplished in a batch type manner. For instance, after a batch or a group of semiconductor chips have been encapsulated by a relatively hot, plastic fluid, they are typically near 180 degrees Celsius. After allowing the batch of encapsulated semiconductor chips to cool down to room temperature, the group of encapsulated semiconductor chips and their associated leadframe strips are loaded into an oven for curing at approximately 150–160 degrees Celsius for 4–5 hours. After the group of encapsulated semiconductor chips has been cured, they are again allowed to cool down to room temperature before they are moved to a dambar cutting/debris removing part of the production line. In review, from the completion of the molding operation to the commencement of the dambar cutting/debris removing operation, a group of leadframe strips and their encapsulated semiconductor chips proceed from 180 degrees Celsius down to room temperature, up to 150–160 degrees Celsius, and back down to room temperature over a period of at least 4–5 hours. Several disadvantages to this approach become evident upon realizing that it would be significantly more time and energy efficient for the 180 degree leadframe strips to be directly input to a curing oven since no time is wasted in waiting for the strips to reach room temperature and since the energy required to raise the strips from room temperature to a curing temperature of approximately 150–160 degrees Celsius is saved. Furthermore, the undesirable thermal stress placed upon the leadframe strips and their encapsulated semiconductor chips which is associated with cooling from 180 degrees Celsius to room temperature and then heating up to 150–160 degrees Celsius is another avoidable aspect of the prior art approaches. In particular, by direct delivery of the 180 degree leadframe strips from a molding apparatus to the 150–160 degree post mold curing apparatus, unnecessary thermal stress is avoided. In addition, it would be advantageous to deliver the leadframe strips automatically, sequentially, and directly from a molding apparatus to a post mold curing apparatus, thereby eliminating unnecessary batch handling of the leadframe strips and, consequently, reducing the likelihood of product malfunctions since, in general, the number of product errors tends to decrease as the amount of product handling is minimized. Therefore, a need existed to create an automatic post mold curing apparatus for use in producing encapsulated semiconductor chips that saves time and energy while simultaneously reducing product defects that are attributed to excess thermal stress on and handling of the products.

SUMMARY OF THE INVENTION

In accordance with one embodiment of this invention, it is an object of this invention to provide an automatic post mold curing apparatus for use in producing encapsulated semiconductor chips.

It is a further object of this invention to provide an automatic post mold curing apparatus that is an integral part of a continuous, in-line system for producing encapsulated semiconductor chips.

It is another object of this invention to provide an automatic post mold curing apparatus that minimizes unnecessary heat-up and cool-down periods associated with the production of encapsulated semiconductor chips, thereby minimizing thermal stress.

It is yet another object of this invention to provide an automatic post mold curing apparatus that minimizes needless handling of leadframe strips and their encapsulated semiconductor chips.

BRIEF DESCRIPTION OF THE PREFERRED EMBODIMENTS

In accordance with one embodiment of this invention, an automatic molding line system for packaging semiconductor chips is disclosed comprising, in combination, wire bonding means for providing wire bonds between portions of each of the semiconductor chips to selected portions of associated leadframe strips, plastic molding means coupled to the wire bonding means for encapsulating each of the semiconductor chips, .marking means coupled to the plastic molding means for marking a plastic housing for each of the semiconductor chips with an identification designation, post mold curing means coupled to the marking means and having a substantially cylindrical shaped assembly and also having a plurality of slots therein for holding the semiconductor chips and the associated leadframe strips and for rotating the semiconductor chips and associated strips through at least a high temperature region and a low temperature region to permit curing of the plastic housing, dambar cutting means coupled to the post mold curing means for removing dambars from the leadframe strips and for also removing excess debris from the plastic housing of each one of the semiconductor chips, plating means coupled to the dambar cutting means for plating selected portions of the leadframe strips, means located between the dambar cutting means and the plating means for off-loading the leadframe strips from the dambar cutting means and for subsequently on-loading the leadframe strips to the plating means, trim and form means coupled to the plating means for removing excess portions from the leadframe strips and for forming leads extending from the semiconductor chips, and means coupled to the trim and form means for moving each of the leadframe strips away from the trim and form means to permit use of completely packaged semiconductor chips. This system also includes means for sequentially inputting the leadframe strips to the cylindrical shaped assembly of the post mold curing means and for sequentially outputting the leadframe strips from the cylindrical shaped assembly of the post mold curing means after each of the leadframe strips complete passage through both the high temperature region and the low temperature region.

In accordance with another embodiment of this invention, a post mold curing apparatus for use in association with a molding line system for providing plastic encapsulated semiconductor chips mounted on leadframes is disclosed comprising, in combination, rotating leadframe carrier means comprising a rotary, substantially cylindrical assembly for containing and moving a plurality of semiconductor chips and their associated leadframe strips into both an elevated temperature post mold curing region and into a lower temperature cool-down region, and means for inserting the semiconductor chips with their associated leadframe strips into cavity regions located in the cylindrical assembly prior to moving each of the plurality of leadframe strips through the elevated temperature post mold curing region and for removing the semiconductor chips with their associated leadframe strips from the cavity regions after passing through the lower temperature cool-down region.

In accordance with yet another embodiment of this invention, a method of operating a post mold curing apparatus for use in association with a molding line system for providing plastic encapsulated semiconductor chips mounted on leadframes is provided comprising the steps of providing rotating leadframe carrier means comprising a rotary, substantially cylindrical assembly for containing and moving a plurality of semiconductor chips and their associated leadframe strips into both an elevated temperature post mold curing region and into a lower temperature cool-down region, and providing means for inserting the semiconductor chips with their associated leadframe strips into cavity regions located in the cylindrical assembly prior to moving each of the plurality of leadframe strips through the elevated temperature post mold curing region and for removing the semiconductor chips with their associated leadframe strips from the cavity regions after passing through the lower temperature cool-down region.

The foregoing and other objects, features, and advantages of the invention will be apparent from the following, more particular, description of the preferred embodiments of the invention, as illustrated in the accompanying drawings.

DESCRIPTION OF THE PREFERRED EMBODIMENT

Figure 1:
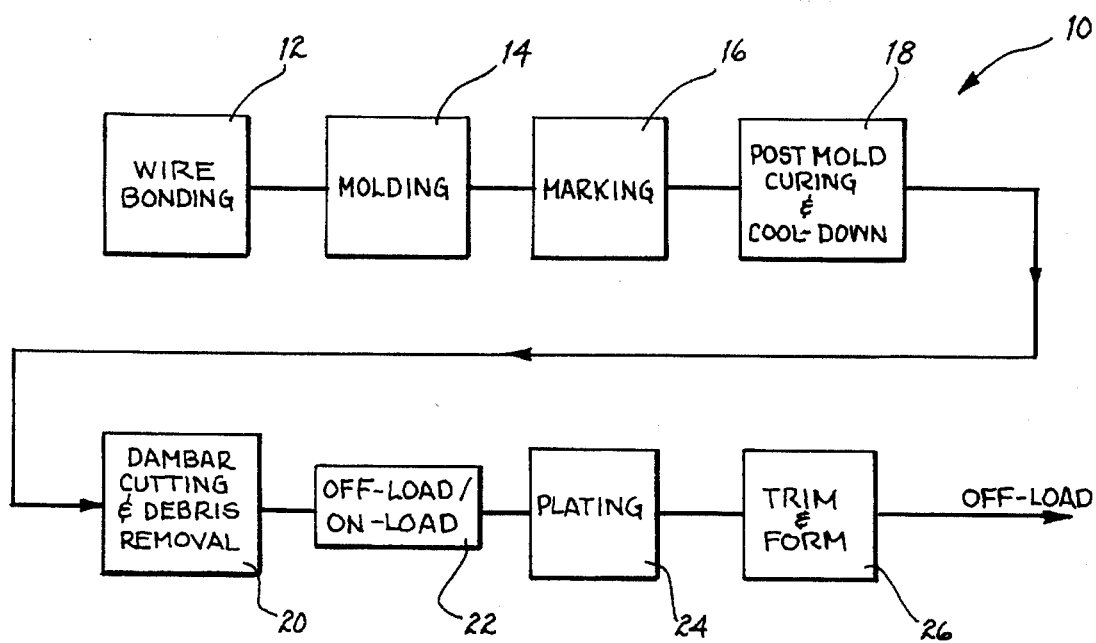
FIG. 1 is a simplified block diagram of the automatic molding line system for packaging semiconductor chips.

Referring to FIG. 1, an automatic molding line system for packaging semiconductor chips is shown and is generally designated by reference number 10. A wire bonding portion 12 creates wire bonds between portions of semiconductor chips and selected portions of associated leadframe strips. The output from the wire bonding portion 12 is coupled to an input of a molding portion 14 of the system 10. The molding portion 14 encapsulates semiconductor chips in plastic. The encapsulated semiconductor chips and their associated leadframe strips leaving the molding portion 14, enter a marking portion 16 where the plastic housing for each semiconductor chip is marked with an identification designation. The output from the marking portion 16 is coupled to a post mold curing and cool-down portion 18. Each one of the plurality of encapsulated semiconductor chips and their associated leadframe strips are sequentially loaded into their respective slot in a substantially cylindrical shaped, rotating assembly of the post mold curing and cool-down portion 18. As the assembly rotates, each of the leadframe strips are moved through both a high temperature region for curing the encapsulated semiconductor chips and a low temperature region for cool-down. Following curing and cooling of the encapsulated semiconductor chips, a dambar cutting and debris removal portion 20 removes dambars from the leadframe strips and dislodges excess debris from the plastic housing of each of the semiconductor chips. A plating portion 24 plates selected portions of the leadframe strips while an off-load/on-load portion 22 is coupled between the dambar cutting and debris removal portion 20 and the plating portion 24. The output from the plating portion 24 is coupled to an input of a trim and form portion 26 which removes excess portions from the leadframe strips and forms extended leads from the semiconductor chips. An OFF-LOAD portion delivers each of the leadframe strips away from the trim and form portion 26 to permit use of completely packaged semiconductor chips.

Figure 2:
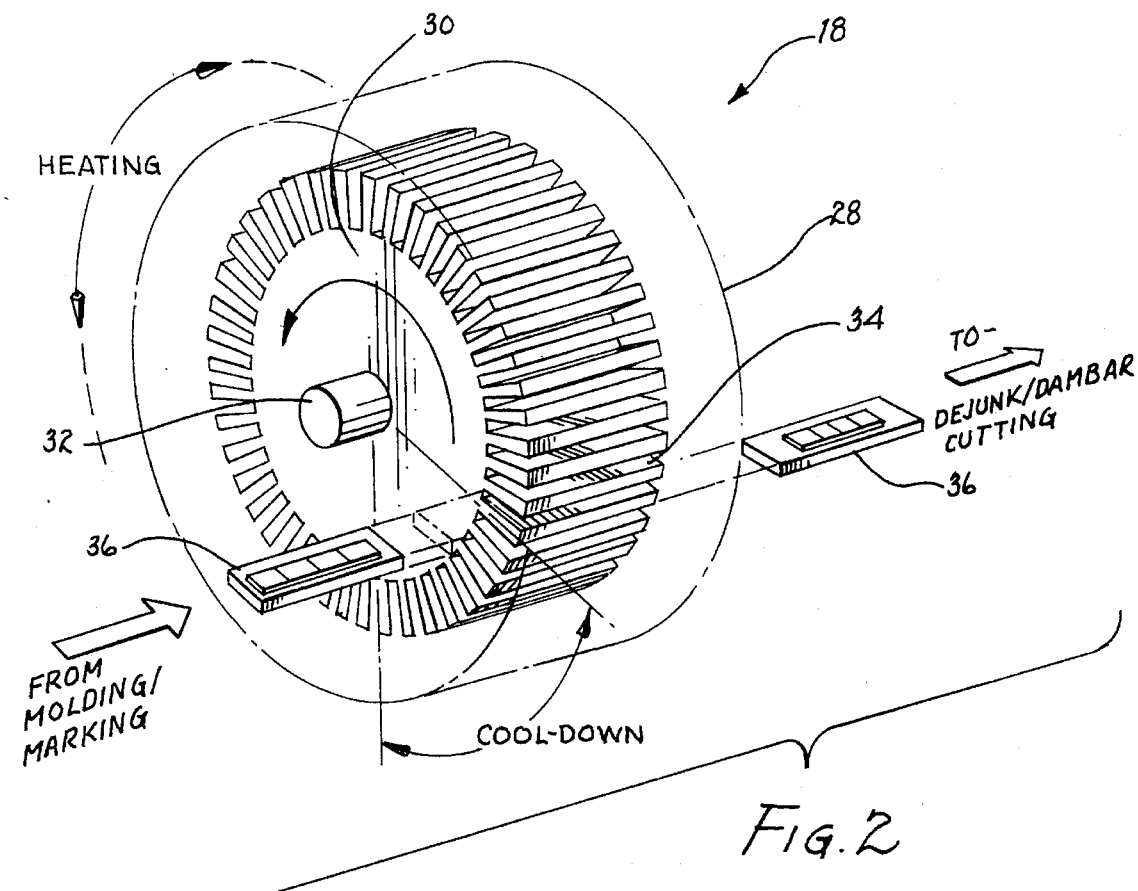
FIG. 2 is a simplified perspective view of the post mold curing and cool-down apparatus showing a leadframe strip with its encapsulated semiconductor chips being inserted into a slot in an elevated temperature post mold curing region and another leadframe strip with its encapsulated semiconductor chips being removed from a slot in a low temperature cool-down region.

Referring to FIG. 2, the post mold curing and cool-down portion 18 of the system 10 from FIG. 1 is displayed as the post mold curing and cool-down apparatus 18. A container 28 functions to enclose and insulate interior portions of the post mold curing and cool-down apparatus 18. Note that the container 28 is provided with at least an input and an output opening to allow the input and the output of each of the leadframe strips 36 with their associated encapsulated semiconductor chips. A rotary, substantially cylindrical shaped assembly 30 has a plurality of slots 34 for holding and moving each of the leadframe strips 36 through both a HEATING or an elevated temperature post mold curing region and a COOL-DOWN or a lower temperature cool-down region as the assembly 30 rotates. A shaft 32 transfers a rotational driving force to the assembly 30 from a drive source which is not shown for the sake of simplicity.

Figure 3:
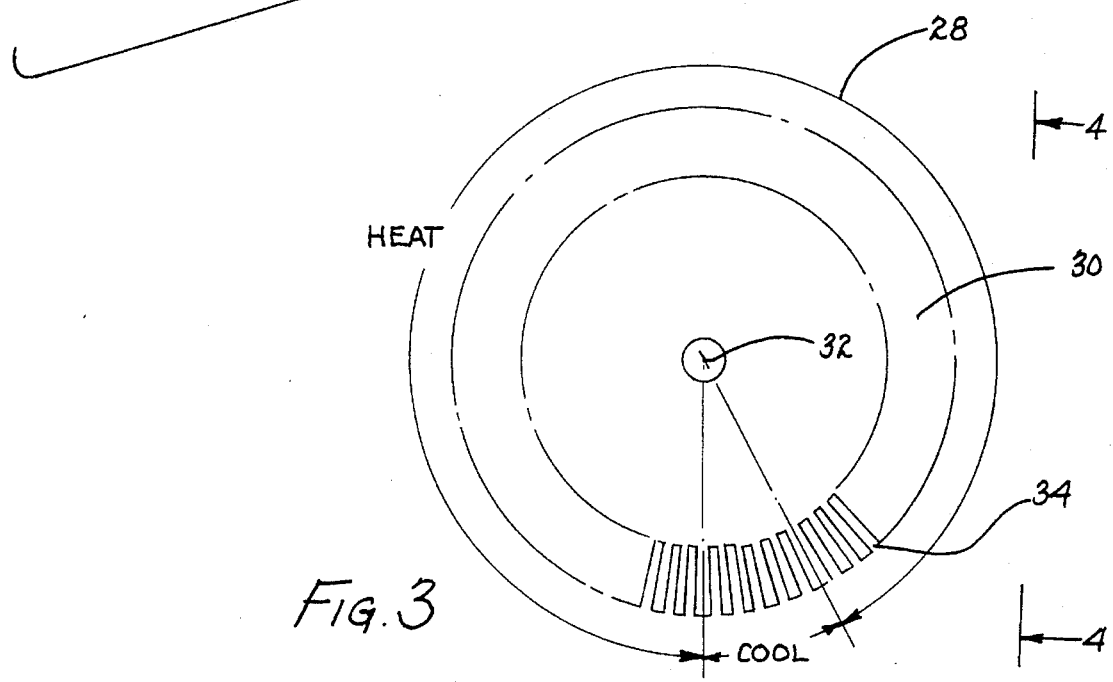
FIG. 3 is a front view of the post mold curing and cool-down apparatus of FIG. 2.

Referring to FIG. 3, a front view of the post mold curing and cool-down apparatus 18 shows only a portion of the slots 34 of the assembly 30. Typically, a larger portion of the circumferential area of the assembly 30 is dedicated to the HEAT application than to the COOL application since, in general, curing of encapsulated semiconductor chips usually requires 4–5 hours while cooling demands less time.

Figure 4:
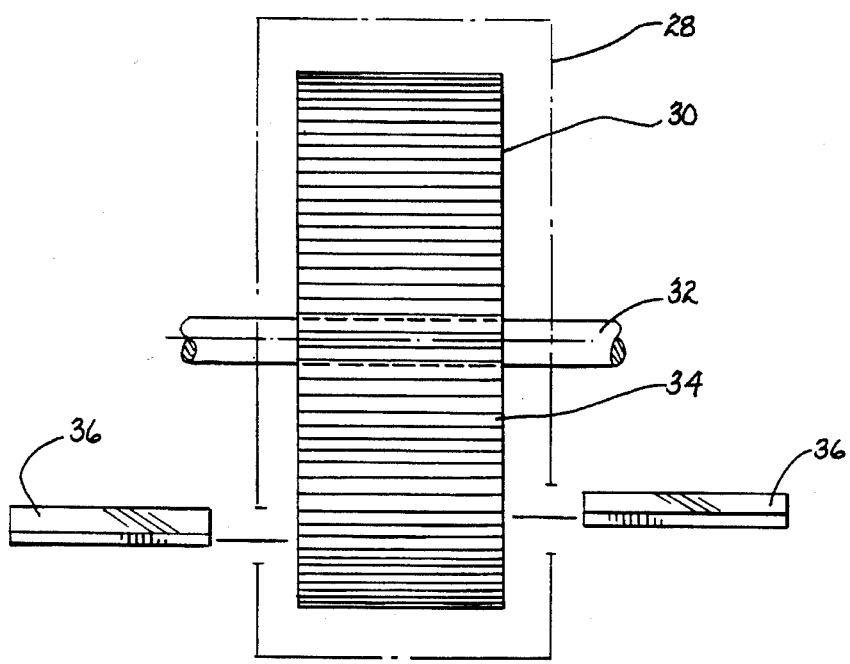
FIG. 4 is a cross sectional view of the post mold curing and cool-down apparatus taken along the line 4—4 of FIG. 3.

Referring to FIG. 4, this view of the post mold curing and cool-down apparatus 18 shows the relative positioning between the input position and the output position for the leadframe strips 36.

OPERATION

Each of the encapsulated semiconductor chips and their associated leadframe strips 36 are sequentially input to one of the slots 34 in the assembly 30. Focusing on a single one of these leadframe strips 36, it rotates through the HEATING region of the post mold curing and cool-down apparatus 18 for a typical period and temperature of 4–5 hours at a 150–160 degrees Celsius. After having been cured, the leadframe strip 36 passes through the COOLING region to bring the temperature of the leadframe strip 36 to approximately room temperature upon exiting through the output slot of the post mold curing and cool-down apparatus 18. Note that as one leadframe strip 36 enters the assembly 30, another leadframe strip 36 exits so that a sequential rather than a batch handling of the leadframe strips 36 is accomplished.

While the invention has been particularly shown and described with reference to the preferred embodiments thereof, it will be understood by those skilled in the art that the foregoing and other changes in form and details may be made therein without departing from the spirit and scope of the invention. For example, the heating and/or cooling times and temperatures could be changed if desired. Also, if desired, one could insert leadframe strips 36 into every other slot 34, or perhaps at some other spacing interval, as opposed to filling every slot 34.

I claim:

1. A post mold curing apparatus for use in association with a molding line system for providing plastic encapsulated semiconductor chips mounted on leadframes comprising, in combination:

rotating leadframe carrier means comprising a rotary, substantially cylindrical assembly for containing and moving a plurality of semiconductor chips and their associated leadframe strips into both an elevated temperature post mold curing region and into a lower temperature cool-down region; and means for inserting said semiconductor chips with their associated leadframe strips into cavity regions located in said cylindrical assembly prior to moving each of said plurality of leadframe strips through said elevated temperature post mold curing region and for removing said semiconductor chips with their associated leadframe strips from said cavity regions after passing through said lower temperature cool-down region.

2. The apparatus of claim 1 wherein said semiconductor chips are integrated circuit chips.

3. The apparatus of claim 1 wherein said cavity regions comprising a plurality of slots with each one of said slots accommodating each one of said plurality of semiconductor chips and their associated leadframe strips.

4. The apparatus of claim 3 wherein each one of said plurality of slots being configured to retain leadframe strips of dissimilar dimensions.

5. The apparatus of claim 1 wherein said elevated temperature region is at an elevated temperature below a molding temperature used to form a plastic encapsulation of said semiconductor chips with their associated leadframe strips.

6. The apparatus of claim 1 wherein said lower temperature cool-down region is substantially equivalent to room temperature.

7. The apparatus of claim 1 wherein said means for inserting incrementally inserts each one of said plurality of leadframe strips one at a time into one of said cavity regions of said rotary, cylindrical assembly.

8. The apparatus of claim 1 wherein said means for removing incrementally ejects each one of said plurality of leadframe strips one at a time from one of said cavity regions of said rotary cylindrical assembly.

\* \* \* \* \*